United States Patent [19]
[11] 3,891,438
Katz et al.
[45] June 24, 1975

[54] AQUEOUS DEVELOPING COMPOSITION FOR LITHOGRAPHIC DIAZO PRINTING PLATES

[75] Inventors: Leon Katz, Springfield, N.J.; Eugene Golda, Monsey, N.Y.

[73] Assignee: Polychrome Corporation, Yonkers, N.Y.

[22] Filed: Nov. 2, 1972

[21] Appl. No.: 303,072

[52] U.S. Cl. .......... 96/49; 96/33; 96/35.1; 96/48 R; 101/465; 101/467; 252/351; 252/352; 252/353; 252/356; 252/358; 260/309.6

[51] Int. Cl. .......... G03c 5/34; G03f 7/08

[58] Field of Search ...... 96/33, 48 PD, 48, 49, 35.1, 96/66 R, 114.5, 66 HD; 101/465, 466, 467, 456; 252/351, 352, 353, 356, 358; 260/309.6

[56] References Cited

UNITED STATES PATENTS

| | | | |
|---|---|---|---|
| 2,820,043 | 1/1958 | Rainey et al. | 260/309.6 |
| 3,091,533 | 5/1963 | Hodgins | 96/33 X |
| 3,113,026 | 12/1963 | Sprung | 96/114.5 X |
| 3,471,289 | 10/1969 | Herrick | 96/33 |
| 3,555,041 | 1/1971 | Katz | 260/309.6 |
| 3,568,598 | 3/1971 | Abbott | 101/456 X |
| 3,637,384 | 1/1972 | Deutsch et al. | 96/33 X |
| 3,660,097 | 5/1972 | Mainthia | 96/33 X |
| 3,679,419 | 7/1972 | Gillich | 96/33 X |
| 3,751,257 | 8/1973 | Dahlman | 96/33 X |
| 3,819,647 | 6/1974 | Foley | 260/309.6 |
| 3,840,553 | 10/1974 | Neel et al. | 260/309.6 |

*Primary Examiner*—Charles L. Bowers, Jr.

[57] ABSTRACT

A developer composition for photosensitive coatings on substrates, particularly lithographic printing plates sensitized with substantially water-insoluble diazonium compounds, which is comprised of an aqueous solution of an amphoteric surfactant. The novel developers quickly remove non-image areas of the plate and yet do not detrimentally dissolve the image areas of the plate.

4 Claims, No Drawings

AQUEOUS DEVELOPING COMPOSITION FOR LITHOGRAPHIC DIAZO PRINTING PLATES

This invention relates to a developing system for photosensitive coatings on substrates, particularly diazo-sensitized photosensitive coatings on substrates, e.g., lithographic printing plates, and more particularly to compositions for developing an exposed lithographic plate to remove non-image areas and to prepare the plate for press.

Lithographic printing utilizes the immiscibility between oleophilic inks and an aqueous dampening fluid on a substantially planar printing plate surface. An oleophilic image area that corresponds to an image to be printed is formed on a plate, and the remainder of the plate surface, the non-image area, is or is made hydrophilic in character. The image area accepts greasy ink and transfers the ink during printing; the non-image area is kept damp with water or an aqueous dampening fluid and repels the ink so that no printing occurs from that area. To form such a printing plate, a flat base surface is coated with a very thin layer of a light-sensitive material and exposed to light through a transparent film having opaque areas. A negative transparency of the image desired to be reproduced is used for exposing a so-called negative-acting plate, and a positive transparency is used for exposing a so-called positive-acting plate. Light passes through the clear areas of the negative transparency, which correspond to the image, and causes a reaction in the light-sensitve coating on the underlying plate that "hardens" the coating in the image area. Light does not pass through the opaque areas of the transparency, however, so that the light-sensitive coating on the plate underlying such areas remains unaffected. The plate is then developed by removing the coating from the plate in unexposed areas, which are hydrophilic, or are then made hydrophilic. The positive-acting plate differs from the negative-acting plate in that in the former the light passing through the clear areas of the positive transparency causes the light-sensitive coating on the underlying plate to decompose to some extent, thereby resulting in a solubility differential between image and non-image areas. The exposed areas of the positive-acting plate are removed.

In the past, negative working diazo-sensitized lithographic plates have generally been developed with solvents. Some of the solvents used have been isopropyl alcohol, normal propyl alcohol, Cellosolve (ethylene glycol monoethyl ether), butyl alcohol, benzyl alcohol etc. Some developers consist essentially of organic solvents whereas others contain water in addition to the organic solvents. In either the organic solvent type or the aqueous type, aromatic sulfonic acids or their sodium salts have been used. These developers have suffered from one or more disadvantages when used to develop negative working diazo-sensitized lithographic plates. For example, a mixture of 20 percent normal propyl alcohol and 80 percent water, when used to develop lithographic plates, has a tendency to overdevelop the plates because of narrow solubility differential between image and non-image areas.

Sulfonic acids have been used in developers, but they have several disadvantages. They are more corrosive than the amphoteric surfactants of this invention and when used in a developing machine will tend to corrode its bearings, piping and other metallic parts. Perhaps because of this corrosive nature and its effect on image areas, plates developed with developers containing sulfonic acids do not print as many copies as those developed with the developers of this invention. Surfactant-type wetting agents are preferred in many formulations. Sulfonic acids, e.g., 2-hydroxy-4-methoxybenzophenone-5-sulfonic acid, tend to decompose and precipitate surfactant-type wetting agents in developer compositions. Those same wetting agents result in undesirable foaming when used in developing machines. The aforementioned sulfonic acid is an ultraviolet light absorber; and as it absorbs, it discolors. Consequently, an actinic-absorbing material must be used as the material for bottles containing it.

Developers containing sodium salts of sulfonic acids and solvents such as glycols instead of surfactant-type wetting agents were found to leave a dirty background when used to machine-develop plates. To clean the background it was necessary to increase the concentration of the sodium salt of the sulfonic acid, but that resulted in a grey scale decreased by about 2 steps, i.e., the dots in the half-tone on the plate were smaller than in the transparency used in exposing it. In contrast the developers of this invention work well without added wetting agents or solvents, leave a clean background on the plate and do not reduce the grey scale.

It has been found that half-tone dots on an exposed plate are attacked and sharpened most by solvents, and then by sulfonic acids and their sodium salts in that decreasing order. Use of developers of this invention containing amphoteric surfactants results in little, if any, attack on and sharpening of half-tone dots.

The aforementioned disadvantages of the prior art are eliminated or minimized by the developers of this invention.

It is an object of this invention to provide an improved developing system for lithographic printing plates. A more particular object of this invention is to provide an improved developer composition for removing non-image areas from lithographic printing plates on which the light-sensitive agent in the coating thereon is a substantially water-insoluble diazonium compound.

The foregoing objects and others which will be apparent from the following description are achieved through use of our aqueous developing compositions containing an amphoteric surfactant that readily removes from exposed lithographic plates the non-image areas of the light-sensitive coating in which the light-sensitive component is a diazonium compound or a photopolymer, particularly a substantially water-insoluble diazonium compound or a photopolymer. Generally, the developer composition is comprised of water and an amphoteric surfactant as hereinafter illustrated. In some developer compositions of this invention, wetting agents and other components may be utilized in the composition to decrease the time required for development of the lithographic plate or to modify other characteristics of the developer compositions.

One of the important types of known negative-acting diazo components utilized in lithographic plates is comprised of reaction products of a light-sensitive diazo-containing compound and a coupling agent, which reaction products retain their light-sensitivity. The reaction products, however, generally have less water-solubility than either of their components, and generally tend to be substantially insoluble in water. Thus, while such reaction products can conveniently be coated onto bases from solvent and even from dilute aqueous solutions to make plates, their development by aqueous developers is difficult because of the relative insolubility in water or the lack of sufficient selective solubility between exposed and unexposed areas—so-called differential—in solvents.

The light-sensitive diazo-containing components of the reaction products are the negative-containing diazonium compounds known and commonly used in the lithographic art. Broadly they are diazo-aromatics, and more particularly diazo-arylamines, that can be substituted on the aromatic nucleus or on the amino-nitrogen. The most commonly used of such diazo compounds is para-diazo-diphenylamine and derivatives thereof, especially reacted with organic condensing agents containing reactive carbonyl groups, such as aldehydes and acetals, particularly with compounds such as formaldehyde and para-formaldehyde. The preparation of some such eminently suitable condensation products is disclosed in U.S. Pat. Nos. 2,922,715 and 2,946,683.

To form the light-sensitive substantially water-insoluble diazonium coating components, the diazo-aromatic compounds mentioned above preferably are reacted with aromatic or aliphatic compounds having one or more phenolic hydroxyl groups or sulfonic acid groups $—SO_3$, or both. Examples of reactants having phenolic hydroxyl groups are hydroxy benzophenones, diphenolic acids such as 4,4-bis(4′-hydroxyphenyl)-pentanoic acid, resorcinol and diresorcinol, which can be further substituted. Hydroxy-benzo-phenones include 2,4-dihydroxy-, 2-hydroxy-4-methoxy-, 2,2′-dihydroxy-4,4′-dimethoxy- and 2,2′,4,4′-tetrahydroxy-benzophenone. Preferred sulfonic acids are those of the aromatic series, particularly of benzene, toluene, xylene, naphthalene, phenol, naphthol and benzophenone, and the soluble salts thereof such as the ammonium and the alkali metal salts. The sulfonic acid group-containing compounds generally can be substituted by lower alkyl, nitro and halo groups as well as additional sulfonic acid groups. Examples of such compounds include benzene sulfonic acid, toluene sulfonic acid, naphthalene sulfonic acid, 2,5-dimethyl-benzene sulfonic acid, benzene sodium sulfonate, naphthalene-2-sulfonic acid, 1-naphthol-2-(or 4-)-sulfonic acid, 2,4-dinitro-1-naphthol-7-sulfonic acid, 2-hydroxy-4-methoxy-benzophenone-5-sulfonic acid, m-(p′-anilino-phenylazo)-benzene sodium sulfonate, alizarin sodium sulfonate, o-toluidine-m-sulfonic acid and ethane sulfonic acid.

The diazo compound and the coupling agent are reacted together, preferably in aqueous solution at a pH of below about 7.5, in approximately equimolar quantities. The reaction product is usually isolated as a precipitate, and can be coated by common techniques onto appropriate lithographic base sheets to form sensitized plates, as described, for example, in U.S. Pat. No. 3,300,309.

Illustrative of the positive-acting diazo-sensitized photosensitive coatings on substrates are those described in U.S. Pat. No. 3,544,317 of T. Yonezawa.

The essential active ingredient of the developer compositions of this invention is an amphoteric surfactant. Amphoteric surfactants are so named because they contain both an anionic and a cationic group. They behave as cationic surfactants in acid media and anionic surfactants in alkaline solutions.

A characteristic property of amphoteric surfactants is the fact that they possess an isoelectric point where the product is internally neutralized and a zwitterion is formed. At this point, amphoterics frequently exhibit a minimum solubility, foam, wetting, and surface tension reduction. In neutral or slightly alkaline solutions they exhibit the high foaming and detergency properties of anionic surfactants while showing substantivity to fibers, metal, etc. usually associated with cationic agents.

The cationic character of amphoterics is due to a basic nitrogen which may be present as a primary, secondary, tertiary or quaternary nitrogen group. The anionic portion may be derived from a carboxyl, sulfate, sulfonate or phosphate radical.

In order for amphoteric materials to function effectively as surfactants, they should contain an alkyl group having from about 6–20 carbon atoms.

Illustrative of the amphoteric surfactants which may be used in the developer compositions of this invention are those based on substituted imidazolines such as the Monaterics available from Mona Industries, Inc., Paterson, N.J. The imidazoline surfactants may be prepared by reacting long chain imidazolines with halogenated or organic intermediates containing carboxyl, phosphoric, or sulfonic acid groups. Other imidazoline-based surfactants that may be used are, e.g.,

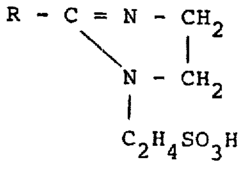

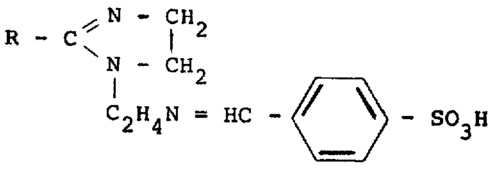

and their sodium salts, wherein R is as hereinafter described. This group of amphoteric surfactans is preferred in the developer compositions of this invention.

Another class of amphoteric surfactants which may be used are β-alanine derivatives characterized by the following formulae:

$$RNHCH_2CH_2COOX$$

and $$RN(CH_2CH_2COOX)_2$$

In these formulae, R represents an aliphatic hydrocarbon chain of from about 6 to 20 carbon atoms such as octyl, nonyl, decyl, undecyl, dodecyl, tridecyl, tetradecyl, pentadecyl, hexadecyl, heptadecyl and octadecyl; X represents hydrogen or a cation such as an alkali metal, e.g., sodium, potassium, lithium, ammonium or an organic amine cation such as diethanolamine, triethylamine, triethanolamine, morpholine or piperidine. These compounds are prepared by reacting a primary amine having from about 6 to 20 carbon atoms with chloropropionic or bromopropionic acid in the presence of an alkali such as sodium hydroxide or potassium carbonate.

The compounds can also be prepared in accordance with the method described in U.S. Pat. No. 2,468,012 by condensing at 25°–30°C., a primary amine containing from 6 to 20 carbon atoms with methyl acrylate to form the β-alkylaminopropionate. The methyl ester is hydrolyzed to an acid or converted to the alkali or organic amine salts by the conventional method of saponification. The secondary amine is obtained by the use of molar proportions whereas the tertiary amine is obtained by using at least two molar equivalents of the acid derivatives.

In the selection of the amines, it is usually more economical to select those with an even number of hydrocarbon atoms because they are commercially available. The mixtures of amines obtained from coconut, soybeans or tallow may be used with equal success. Other compounds which may be used include the following:

$$C_{12}H_{23}NH.CH_2Ch_2COONa$$

Sodium N-dodecyl-β-aminopropionate $$C_{10}H_{21}NH.CH_2CH_2COOH$$

N-decylβ-aminopropionic acid $$C_{14}H_{29}NH.CH_2CH.COOK$$

Potassium N-tetradecylβ-aminopropionate $$C_{16}H_{33}NH.CH_2CH_2COONa$$

Sodium N-hexadecylβ-aminopropionate $$C_{18}H_{37}NH.CH_2CH_2COONa$$

Sodium N-octadecylβ-aminopropionate $$C_{12}H_{25}N(CH_2CH_2COOH).CH_2CH_2COONa$$

Monosodium salt of N-dodecylβ-aminodipropionate $$C_{18}H_{37}N(CH_2CH_2COONa)_2$$

Disodium N-octadecylβ-aminodipropionate

Another class of amphoteric surfactants which may be used comprises the betaine derivatives which contain a long hydrocarbon chain. These betaine derivatives are characterized by the following formula:

$$R_1-\overset{+}{N}(CH_3)(CH_3)-CH_2-COO^-$$

in which $R_1$ represents an aliphtic hydrocarbon radical of from about 6 to 20 carbon atoms. These betaine compounds are prepared by reacting a tertiary higher alkyl amine such as dodecyldimethylamine, tetradecyldimethylamine or hexadecyldiethylamine with chloroacetic acid. These compounds can also be prepared by condensing the tertiary amine with a halogenated carboxylic ester and saponifying the ester as described in U.S. Pat. No. 2,082,275.

The amphoteric surfactants of this invention may be used either alone or in conjunction with other surfactants or wetting agents; such as, the taurines, saponin or polyoxyethylene derivatives of long chain fatty acids and alcohols.

There appears to be no limitation on the amount of amphoteric surfactant in the developer solutions other than those dictated by practical considerations. For example, economics and the solubility of the compound in water or the aqueous developer system governs a practical upper limit of concentration, whereas time of development principally governs the lower limit. For example, at concentrations of about 1 percent, the development time is in the order of about 5 or more minutes, which from a busy lithographer's standpoint is inordinately long compared to the roughly one-half minute to about 2 minutes that he finds desirable. That desired range of time can be obtained with the instant developing systems at solution concentrations of from about 5 percent to about 30 percent by weight of amphoteric surfactant in solution. The preferred range of concentration is about 10 percent to about 20 percent, which gives good development time, in the order of about 1 minute, and also provides sufficient water for dissolution and removal of the unexposed coating without the need for excessive rinsing.

The developer composition of this invention may be formulated in a concentration in water which is directly useful for developing lithographic plates, or it may initially be formulated as a concentrate, i.e., an aqueous solution in which the active ingredients are present at a concentration higher than necessary for use as a developer. This is advantageous for shipping and storage purposes. Before use the concentrate should be diluted with water to the preferred working concentration. The concentrate may be up to about three times more concentrated than the working solution. In the concentrate the amphoteric surfactants may be present in an amount from about 15 percent to about 50 percent.

It may be desirable to also include in the developer solutions additional ingredients to facilitate development and to provide plate treatment. Such ingredients are, e.g., solvents, wetting agents or surfactants, metal cleaners, etc. For example, although not necessary, up to about 30 percent by weight of a solvent miscible with the water is helpful to assist removal from the nonimage area of the diazonium compound or especially to help dissolve organic resin either admixed with the diazonium compound in the coating on the plate or as a coating on top of the diazonium compound. The solvent is also helpful as a penetrant, especially instead of all or a part of a conventional surfactant wetting agent when the developer is to be used in a developing machine where the conventional wetting agent would have a tendency to foam undesirably. Preferably, there is used up to about 25 percent, more preferably up to about 20 percent and most preferably from about 5 percent to 15 percent of solvents such as cyclohexanone, benzyl alcohol, dimethylformamide, dimethylsulfoxide, normal propyl alcohol, isopropanol, dioxane and methyl Cellosolve, etc. Surfactants, or wetting agents, to promote contact between the aqueous developer and the light-sensitive coating can be used in amounts up to about 5 percent or 10 percent by weight.

The wetting agents which may be used in the novel developer compositions of this invention may be nonionic, anionic or cationic. Developer compositions containing organo-lithium salts and amphoteric surfactants are the subject of an application of L. Katz, W. Rowe and E. Golda filed concurrently herewith.

Illustrative of the wetting agents which may be used are:

Anionic

Such agents include ammonium and alkali metal salts of long-chain alcohol sulfates, for example, sodium lauryl sulfate, sodium octyl sulfate, ammonium lauryl sulfate, sodium N-methyl-oleyl taurate, dioctyl sodium sulfosuccinate, sodium dodecylbenzene sulfate.

Sodium di(2-ethylhexyl) phosphate [Tergitol P-28 (Union Carbide)]

Duponol series (du Pont) [generally sodium alkyl sulfates]

Duponol Ep, a liquid alkyl alkylolamine sulfate (du Pont)

Avirol 116 (Henkel, Inc.) [sodium lauryl ether sulfate needles]

Avirol 111 LC (Henkel, Inc.) [liquid sodium alkyl sulfate], etc.

Nonionic

Tergitol 15-S-3 (Union Carbide) [a liquid polyethylene glycol ether of a linear alcohol having an HLB* of 8.0]

Tergitol NPX (Union Carbide) [a liquid nonylphenyl polyethylene glycol ether having an HLB* of 13.6]

Tergitol NP-35 (Union Carbide) [a paste nonylphenyl polyethylene glycol ether having an HLB* of 15.0]

Gaftex Texol 237 (GAF Corporation) [a diethanolamine lauric acid condensate]

Glycerol monostearate

Polyoxyethylene glycol monostearate

* Hydrophil-Lipophil Balance

Cationic

Gafstats (GAF) [quaternary ammonium derivatives]

Aerosol C 61 (American Cyanamid Co.) [an ethanolated alkylguanidine amine complex] etc.

The most preferred wetting agents are the anionics, nonionics are next and then cationics. Of the anionics, the alkyl alkylolamine sulfates and sodium lauryl ether sulfates are preferred. Of the nonionics, the first three listed above are preferred.

It is preferred that the wetting agents, particularly the nonionic ones, have a hydrophil-lipophil balance (HLB) of at least about 8.

The developer compositions of this invention may also contain the aromatic or aliphatic compounds having a sulfonic acid group —$SO_3$—, which are used in the developer compositions described in U.S. Pat. No. 3,669,660 of E. Golda and A. Taudien.

Such compounds in general are the same as the ones previously described as being suitable for making, with the diazo compound, the light-sensitive reaction product that is in the sensitized coating on the plate. Examples of such compounds include benzene sulfonic acid, toluene sulfonic acid, naphthalene sulfonic acid, 2,5-dimethyl-benzene sulfonic acid, benzene sodium sulfonate, naphthalene-2-sulfonic acid, 1-naphthol-2-(or -4-)-sulfonic acid, 2,4-dinitro-1-naphthol-7-sulfonic acid, 2-hydroxy-4-methoxy-benzo-phenone-5-sulfonic acid, m-(p'-anilino-phenylazo)-benzene sodium sulfonate, alizarin sodium sulfonate, o-toluidine-m-sulfonic acid and ethane sulfonic acid. The sulfonic acid group containing compounds are dissolved in water to form developer solutions.

Certain formulations of the developers of this invention evidence unique synergistic effects. For example, the amphoteric surfactant moderates the action of solvents. A developer composition containing 5 percent of an amphoteric surfactant and 23 percent of solvent is effective in removing non-image areas from the diazo-sensitized coating, but does not adversely affect the image area. However, if the percent of amphoteric surfactant in the formulation is halved, the developer composition attacks the image area of the coating. The amphoteric surfactant speeds up the action of other components of developer formulations, e.g., the sulfonic acids and their sodium salts mentioned above.

Up to about 5 percent by weight of phosphoric acid or oxalic acid can also be used in the developer composition of this invention as agents to clean the aluminum base sheet after the desensitized coating is removed. Other similar agents known in the art can, in general, also be used if desired.

The pH's of the developers of this invention generally range from approximately neutral, i.e., a pH of about 5 to about 10, and some range as high as 11 or 12 or higher. This wide pH range affords a great latitude for developer formulation without adverse effect on the activity or efficiency of the developer. It is well known that at increasingly alkaline pHs there is a tendency for diazo compounds to irreversibly couple and become relatively insoluble. If an alkaline developer were to indiscriminately harden both image and non-image areas of a diazo lithographic plate it would not be considered an effective developer. It is surprising that the developers of this invention, which range in alkalinity up to a pH of approximately 11 or 12, are successful in faithfully developing lithographic plates. In view of the tendency for diazo compounds to couple under alkaline conditions, many of the prior art developers which utilized for example, sodium salts of aromatic sulfonic acids contained excess phosphoric, oxalic, citric or sulfonic acid or any other acid, which was used in order to obtain a low pH.

The developers of this invention may be applied to exposed photosensitive coatings, particularly diazo-sensitized coatings, either manually or by machine. The sophisticated formulator will, of course, formulate the developer composition in accordance with the teachings of this invention to develop the particular exposed coating, whether it be on a lithographic printing plate (either presensitized or of the wipe-on kind) or on any other surface, e.g., paper or a clear plastic film as in a proofing system to proof color separation transparencies. The developer formulations of this invention are useful in developing positive-acting systems, and are particularly useful and efficient in developing negative-acting systems. For developing positive-acting systems it is preferred that the developer be on the alkaline side, preferably at a pH of at least about 12, but lower pHs may also be used. In view of the universality of some of the developers of this invention, e.g., those containing the sulfonic acid group of U.S. Pat. No. 3,669,660, it is possible for the lithographer to use one developer composition for both negative and positive-working systems. The use of a single developer for both systems is particularly useful and time-saving when a developing machine is used. The use of a single developer means that it is not necessary, e.g., to drain a negative system developer, rinse the machine and then fill with a positive system developer, to develop the different kinds of systems. Universality is extended to more kinds of plates, especially those having coatings containing organic resins, if the developers also contain solvents.

In the following Examples all parts and percentages are by weight.

EXAMPLE 1

One surface of each of two aluminum plates was brush-grained, anodized and chemically treated with potassium zirconium fluoride to form a coating which functions as an interlayer in the finished plates. The treated plate surfaces were then coated by means of a whirler with a light-sensitive coating comprising: 4 parts of sensitizer (addition product of 2-hydroxy-4-methoxy-benzophenone-5-sulfonic acid and para-diazo diphenyl amine-formaldehyde condensate) and 1 part of a glycidyl ether polyepoxide. The coating on one plate had a weight of about 100 mg/ft.$^2$. The coating on the other plate had a weight of about 50 mg/ft.$^2$. After exposure of the plates (which had been aged about 3 months) to ultraviolet light for 2 minutes through a negative transparency, unexposed areas of the plates were easily removed with the following developer formulations to yield commercially acceptable lithographic plates:

| | | | |
|---|---|---|---|
| a) | 30% | Sodium salt of 2-caprylic-1 (ethyl beta oxipropanoic acid) imidazoline | pH 11 |
| | 70% | Water | |
| b) | 50% | Sodium salt of 2-caprylic-1 (ethyl beta oxipropanoic acid) imidazoline | |
| | 50% | Water | |

Development was faster with the (b) developer. More details about the test are summarized in Table I.

Table I above gives data on press performance of plates developed with the different developer compositions. The method of development was by hand application of the developer with an applicator pad. The image areas and non-image areas are described. The grey scale used is a continuous tone 21-step guide which is available from Stouffer Graphic Arts Equipment Company (South Bend, Ind.). The press run was conducted by locking-up the plate on a Chief 22 lithographic press which was 0.006 inch "over-packed," by which is meant that the plate was shimmed-up to 0.006 inch higher than normal, thereby causing the plate to contact the rollers with a pressure greater than would normally be used. Overpacking causes excessive wear of the plate compared to what would occur on a properly adjusted press. The fountain solution contained 35 percent isopropanol. Usually fountain solutions contain no more than 25 percent alcohol. The more alcohol in the fountain solution, the greater the adverse effect on the image area of the plate that can be expected. The ink used was Chromatone No. 4559 (a product of Chromatone Printing Ink Company, a subsidiary of Polychrome Corporation). The paper used was 70 lb. white offset paper which was reused a maximum of three times. 5,000 copies were printed and the quality of the printing was as indicated in the column of the Table entitled "Press Run."

EXAMPLE 2

The procedure of Example 1 was repeated to make plates with the coating weights indicated, which were then developed with developer compositions as described in Example 1, but which had their pH's adjusted to 4 with 4 percent phosphoric acid. The developed plates were evaluated in accordance with the procedures of Example 1 and found to be similar to the developed plates of Example 1.

EXAMPLE 3

The procedures of Example 1 were repeated, but the developer formulation was as indicated in Table II which follows. The results are also indicated in that Table.

TABLE I

Data on Plate Development by Different Developers
2 Minutes Exposure in Nu Arc (Carbon Arc) Exposure Frame

| DEVELOPER | COMPOSITION OF PLATE COATING (Pts. by Wt.) | COATING WEIGHT (mg/sq.ft.) | SUB-STRATE | METHOD OF DEVEL-OPMENT | IMAGE AREA | NON-IMAGE AREAS | PRESS RUN |
|---|---|---|---|---|---|---|---|
| 30% Amphoteric Surfactant* 70% Water | 4 Sensitizer 1 Glycidyl ether polyepoxide | 50 or 100 | Brush-Grained, Anodized Aluminum; Potassium Zirconium Fluoride Interlayer | By hand using standard applicator | Gray Scale— Solid 5, Tail 8; Halftones reproduction (133 lines/inch screen 5–90%) similar to negative transparency | No coating remaining on plate in unexposed areas | 5000 copies on over-packed press-acceptable reproduction |
| 50% Amphoteric Surfactant* 50% Water | " | " | " | " | " | " | " |

*Sodium salt of 2-caprylic-1 (ethyl beta oxipropanoic acid) imidazoline

TABLE II

Data on Plate Development
2 Minute Exposure in Nu Arc (Carbon Arc) Exposure Frame

| DEVELOPER* | COMPOSITION OF PLATE COATING (Pts. by wt.) | COATING WEIGHT (mg/sq. ft.) | SUB-STRATE | METHOD OF DEVEL-OPMENT | IMAGE AREA | NON-IMAGE AREAS | PRESS RUN |
|---|---|---|---|---|---|---|---|
| 20% Amphoteric Surfactant** 10% Sodium Salt of Xylene Sulfonic Acid 70% water | 4 Sensitizer 1 Glycidyl ether polyepoxide | 50 | Brush-Grained, Anodized Aluminum; Potassium Zirconium Fluoride Interlayer | By hand using standard applicator | Gray Scale—Solid 3, Tail 7; Halftones reproduction (133 lines/inch screen 5–90%) similar to negative transparency | No coating remaining on plate in unexposed areas | 5000 copies on over-packed press-good reproduction |
| " | " | 100 | " | " | Grey Scale—Solid 2, Tail 6; Halftones reproduction (133 lines/inch screen 5–90%) similar to negative transparency | " | " |

*pH 10.5 – 11
**Sodium salt of 2-caprylic-1 (ethyl beta oxipropanoic acid) imidazoline

EXAMPLE 4

The procedure of Example 1 is repeated but the developer contains 10 percent of the amphoteric surfactant, 20 percent normal propyl alcohol and 5 percent benzyl alcohol, balance water. The developed plate is acceptable for use in commercial lithography.

EXAMPLE 5

An Azoplate Corp. Enco N-2 presensitized lithographic plate was exposed to ultraviolet light through a negative transparency for 2 minutes. It was then developed with the developer composition of Example 4. The plate developed readily to yield a commercially acceptable lithographic plate.

EXAMPLE 6

The procedure of Example 5 was repeated, but an R presensitized lithographic plate manufactured by 3M Company was used instead of the Enco plate. The results were similar.

EXAMPLE 7

A color proofing set prepared in accordance with the teachings of U.K. Pat. No. 1,191,659 and consisting of yellow, cyan, magenta and black presensitized transparencies on a polyester base is exposed, each transparency to its corresponding color separation negative. Each exposed transparency in turn is developed with the developer composition of Example 4. When dried and then placed in proper registration, the set of exposed and developed transparencies gives a very good approximation or proof of the final four color printing.

EXAMPLE 8

A PA 200 positive-acting presensitized lithographic plate sold by Azoplate Corporation was exposed to ultra-violet light through a positive photographic transparency. The exposed plate was developed with the developer composition of Example 4.

EXAMPLE 9

The procedures of Example 4 were repeated, but a du Pont Lydel plate was exposed and developed. The developed plate was judged to be suitable for commercial use in lithography.

What we claim is:

1. A developer composition adapted for developing an exposed diazo-sensitized photosensitive coating on a substrate to remove therefrom non-image areas which comprises an aqueous solution of from 5 percent to 50 percent by weight of the sodium salt of a 2-alkyl-1-(ethyl beta oxipropanoic acid) imidazoline and up to 30 percent by weight of a water-miscible solvent, all percentages being based on the total weight of the ingredients in the developer solution.

2. The developer composition of claim 1 wherein said imidazoline is the sodium salt of 2-caprylic-1-(ethyl beta oxipropanoic acid) imidazoline.

3. The developer composition of claim 1 which further comprises a surfactant selected from the group consisting of non-ionic, anionic and cationic surfactants.

4. A developer composition adapted to developing an exposed diazo-sensitized photosensitive coating on a substrate to remove therefrom non-image areas which comprises an aqueous solution of from 5 percent to 30 percent by weight of the sodium salt of 2-caprylic-1-(ethyl beta oxipropanoic acid) imidazoline and up to 25 percent by weight of a water-miscible solvent, all percentages being based on the total weight of the ingredients in the developer solution.

* * * * *